United States Patent [19]

Enari

[11] Patent Number: 5,130,942

[45] Date of Patent: Jul. 14, 1992

[54] DIGITAL FILTER WITH FRONT STAGE DIVISION

[75] Inventor: Masahiko Enari, Kanagawa, Japan

[73] Assignee: Canon Kabushiki Kaisha, Tokyo, Japan

[21] Appl. No.: 780,440

[22] Filed: Oct. 17, 1991

Related U.S. Application Data

[63] Continuation of Ser. No. 310,547, Feb. 13, 1989, abandoned.

[30] Foreign Application Priority Data

Feb. 24, 1988 [JP] Japan .............................. 63-041451
Feb. 24, 1988 [JP] Japan .............................. 63-041452
Mar. 3, 1988 [JP] Japan .............................. 63-050153

[51] Int. Cl.⁵ .............................................. G06F 15/31
[52] U.S. Cl. .......................... 364/724.01; 364/724.16
[58] Field of Search ....................... 364/724.01, 724.16, 364/724.1

[56] References Cited

U.S. PATENT DOCUMENTS

| | | | |
|---|---|---|---|
| 3,949,206 | 4/1976 | Edwards et al. | 364/724.16 |
| 4,524,423 | 6/1985 | Acampora | 364/724.16 |
| 4,766,563 | 8/1988 | Fujimoto | 364/724.16 |
| 4,809,209 | 2/1989 | White | 364/724.16 |
| 4,811,260 | 3/1989 | Abe et al. | 364/724.01 |

*Primary Examiner*—Tan V. Mai
*Attorney, Agent, or Firm*—Robin, Blecker, Daley & Driscoll

[57] ABSTRACT

In a digital filter of the kind for computing the sum of or a difference between a plurality of different samples having the respective coefficients each of which is less than 1, a dividing operation is performed on each of the samples in a plurality of stages, and an adder is interposed in between dividers in the plurality of stages.

22 Claims, 7 Drawing Sheets n-2 —O—x—O—x—O—x—O—x—O— n-1 —x—O—x—O—x—O—x—O—x— n —O—x—O—x—O—x—O—x—O—

DIGITAL FILTER WITH FRONT STAGE DIVISION

This is a continuation divisional application under 37 CFR 1.62 of prior application Ser. No. 310,547, filed Feb. 13, 1989, now abandoned.

BACKGROUND OF THE INVENTION

1. Field of the Invention

This invention relates to a digital filter and, more particularly, to a digital filter of the kind for computing the sum of or a difference between a plurality of different samples having respective coefficients each of which is less than 1.

2. Description of the Related Art

The video signals have recently become capable of representing image information in a higher degree of definition. In the case of TV signals, for example, the conventional signals of the NTSC system or the like are being replaced with HDTV (high-definition TV) signals. In transmitting the high-definition image signals through a recording medium such as a tape or a disc, a communication satellite, an optical fiber, or the like that can be regarded as a transmission route in a broad sense of the word, they are preferably transmitted in a coded state by changing them from an analog signal form into a digital signal form, because their image quality can be thus prevented from being deteriorated by S/N, jitters, etc.

Meanwhile, in cases where the bandwidth of the video signal is desired to be, for example, at least 30 MHz, the sampling must be accomplished at a rate of at least 60 MHz in accordance with the sampling theorem. Therefore, assuming that the signal is analog-to-digital (A/D) converted at a rate of 74.25 MHz with 8 bits, the transmission rate then becomes (74.25 (MHz)×8 (bit)=) 594 M bits/s, which is a great amount of information.

If the digital signal of such a great amount of information is transmitted as it is, it would exceed the currently conceivable capacity of a single channel transmission route. To solve this problem, varied methods for compressing the great amount of information have been proposed. These methods include a sub-sampling method.

FIG. 1 of the accompanying drawings shows one example of the sub-sampling method. In FIG. 1, marks "x" and "o" respectively denote picture elements. The mark "x" denotes the picture elements to be omitted by the sub-sampling. The mark "o" denotes the picture elements to be actually transmitted. Reference symbols n, n-1 and n-2 represent scanning line numbers. The signal transmission is carried out in the order of the scanning line numbers n-2, n-1 and n. This method is called a line offset sub-sampling method. As shown in FIG. 1, only the picture elements of each line that are in positions deviating by one picture element from the picture elements of another line are transmitted. Accordingly, the information amount is compressed to $\frac{1}{2}$.

FIG. 2 is a block diagram showing in outline the arrangement for sub-sampling a video signal. Referring to FIG. 2, a terminal 1 is arranged to receive an analog video signal. An analog low-pass filter 2 is arranged to limit the frequency band of the input video signal to a band which is not greater than $\frac{1}{2}$ of the sampling frequency of an A/D converter 3. A digital spatial filter 4 is arranged to prevent any disturbance from being caused by an aliasing component produced at the time of the sub-sampling. A reference numeral 5 denotes a sub-sampling circuit. A terminal 6 is arranged to output the sub-sampled video signal.

FIGS. 3(A) and 3(B) are diagrams for explaining signals output from parts of FIG. 2. FIG. 3(A) shows picture elements output from the A/D converter 3. FIG. 3(B) shows picture elements output from the sub-sampling circuit 5. In the arrangement shown in FIG. 2, the digital spatial filter 4 is very important as it determines the picture quality of the video signal after the sub-sampling.

FIG. 4 is a diagram for explaining a computation example of the conventional digital spatial filter. In FIG. 4, reference symbols x1 to x6 respectively denote the sampled values of the picture elements. Symbols n, n-1 and n-2 denote adjacent scanning lines. In the case of this example, a value x6 which results from a filtering action on the picture element related to the sampled value x6 can be obtained from the following computing formula:

$$x6 = [K5\ x6 + K4\ (x4 + x8) + K3\ (x5 + x7) +$$
$$K2\ (x2 + x10) - K1\ (x1 + x3 + x9 + x11)]/a1$$

wherein K1 to K5 respectively represent positive coefficients and a1 represents a positive constant.

With such a computing operation performed for each of the picture elements, filtering can be carried out on the digital video signal. FIG. 5 shows by way of example the details of the digital spatial filter which processes the digital video signal by performing a computing operation in accordance with the formula shown above.

Referring to FIG. 5, an input terminal 11 is arranged to receive the digital video signal. Reference numerals 12a to 12n, 12p and 12q denote delay circuits for delaying the signal for one sampling period. Numerals 13a and 13b denote delay circuits 13a and 13b for delaying the signal for one line period. Numerals 14a to 14i denote adders. A numeral 15 denotes a subtracter. Numerals 16a to 16e are multipliers for performing a multiplying operation by using the respective coefficients K1 to K5. A numeral 17 denotes a divider for performing a dividing operation by using a constant a1. An output terminal 18 is arranged to output a filtered digital video signal.

If the digital signal supplied to the filter of FIG. 5 consists of eight bits, the digital signal output from the filter would be of eight bits. However, the number of bits is increased by a carry which takes place at each part of the filter.

For example, in the case of a digital spatial filter in which K1=16, K2=31, K3=57, K4=8, K5=128 and a1=256, the maximum value and the number of necessary bits at each of parts (A), (B), (C), (D), (E), (F), (G) and (M) are shown below:

|     | maximum value | number of necessary bits |
| --- | --- | --- |
| (A) | 32640 | 15 |
| (B) | 4080 | 12 |
| (C) | 36720 | 16 |
| (D) | 29070 | 15 |
| (E) | 15810 | 14 |
| (F) | 44880 | 16 |
| (G) | 81600 | 17 |
| (M) | 16320 | 14 |

With the number of bits increased in this manner at each part of the filter, the computing speed of each computing device decreases accordingly. As a result, for a video signal sampled at a speed higher than 60M Hz, the length of time required for the computing operation would become longer than one sampling period. Under such a condition, the filtering process would be impossible.

Further, in the case of the conventional spatial filter described above, to facilitate digital computation, the divisor al of the divider 17 is set at a value which is a power of 2. The divider 17 is simply composed of a bit shift circuit. Therefore, the output of the divider 17 is obtained by carrying out a round-down process (disregarding fraction) on the input of the divider 17. As a result of the round-down process, there arises an error of about one level in the output of the divider 17. This error causes some deterioration of information. Further, in a case where the spatial filters are arranged in a multistage connection the information is seriously affected by the propagation and accumulation of this error.

SUMMARY OF THE INVENTION

It is a general object of this invention to solve the above-stated problems of the prior art.

It is a more specific object of the invention to provide a digital filter which is capable of performing a filtering process at a high speed without lowering the accuracy of the filtering process.

Under this object, a digital filter which is arranged according to the invention as an embodiment thereof comprises: sample extracting means including delay means and for outputting simultaneously a plurality of samples relative to one and the same information signal; multiplying means for multiplying the plurality of samples output from the sample extracting means by respective predetermined numbers; first dividing means for dividing at least one of the plurality of samples output from the multiplying means by a predetermined number; adding means for adding together the plurality of samples output from the first dividing means; and second dividing means for dividing an output of said adding means by a predetermined number.

It is another specific object of the invention to provide a digital filter which is arranged to enhance the degree of filtering accuracy without necessitating a complex hardware structural arrangement.

Under that object, a digital filter which is arranged according to the invention as another embodiment thereof comprises: sample extracting means including delay means and for outputting simultaneously first and second samples relative to one and the same information signal; multiplying means for multiplying the first sample output from the sample extracting means by a first predetermined number; a look-up table for multiplying the second sample output from the sample extracting means by a second predetermined number to obtain a multiplication result and for adding a third predetermined number to the multiplication result to obtain an output; adding means for adding the output of the look-up table and the first sample output from the multiplying means; and dividing means for dividing an output of the adding means by a fourth predetermined number.

It is a further object of the invention to provide a computing circuit which is capable of accurately performing multiplication by a coefficient less than 1 with a simple structural arrangement.

To attain this object, a computing circuit which is arranged according to the invention as an embodiment thereof comprises: input means for inputting simultaneously a plurality of samples; a plurality of computing means for subjecting the plurality of samples input by the input means to the respective predetermined computing operations, at least one of the plurality of computing means including a look-up table for multiplying the sample input thereby by a first predetermined number to obtain a multiplication result and for adding a second predetermined number to the multiplication result to obtain an output; adding means for adding together the plurality of samples output from the plurality of computing means; and dividing means for dividing an output of the adding means by a third predetermined number.

The above and further objects and features of the invention will become apparent from the following detailed description of embodiments thereof taken in conjunction with the accompanying drawings.

DETAILED DESCRIPTION OF THE PREFERRED EMBODIMENTS

Figures 1, 2:
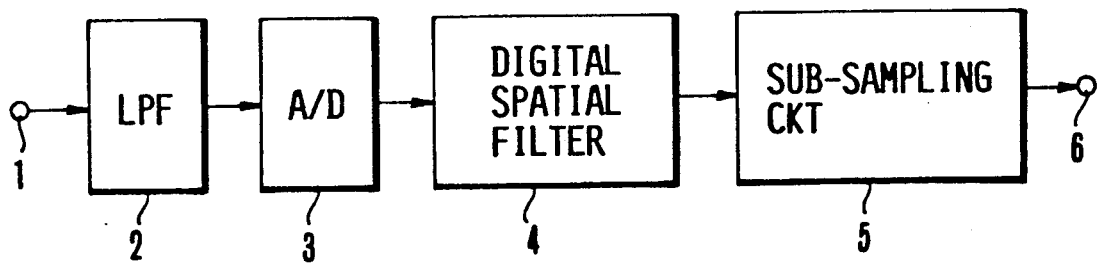
FIG. 1 is an illustration for explaining an example of a sub-sampling operation.
FIG. 2 is a block diagram showing in outline an arrangement for sub-sampling a video signal.
Figure 3A:
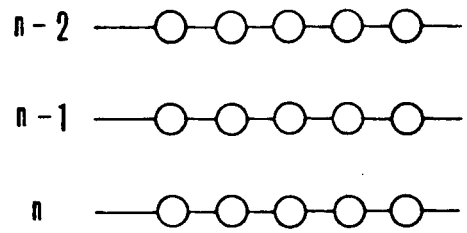
FIGS. 3(A) and 3(B) are illustrations for explaining signals output from various parts of FIG. 2.
Figure 3B:
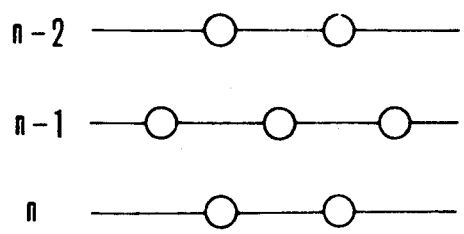
Figure 4:
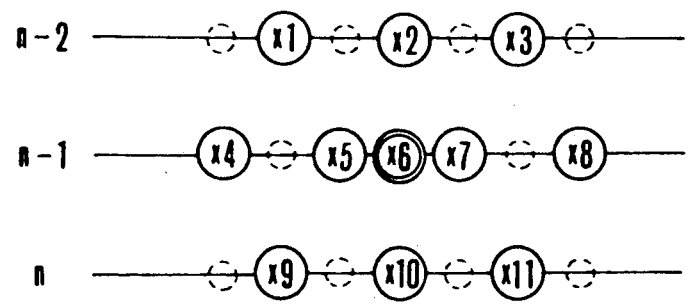
FIG. 4 is an illustration for explaining an example of the computing operation of the conventional digital spatial filter.
Figure 5:
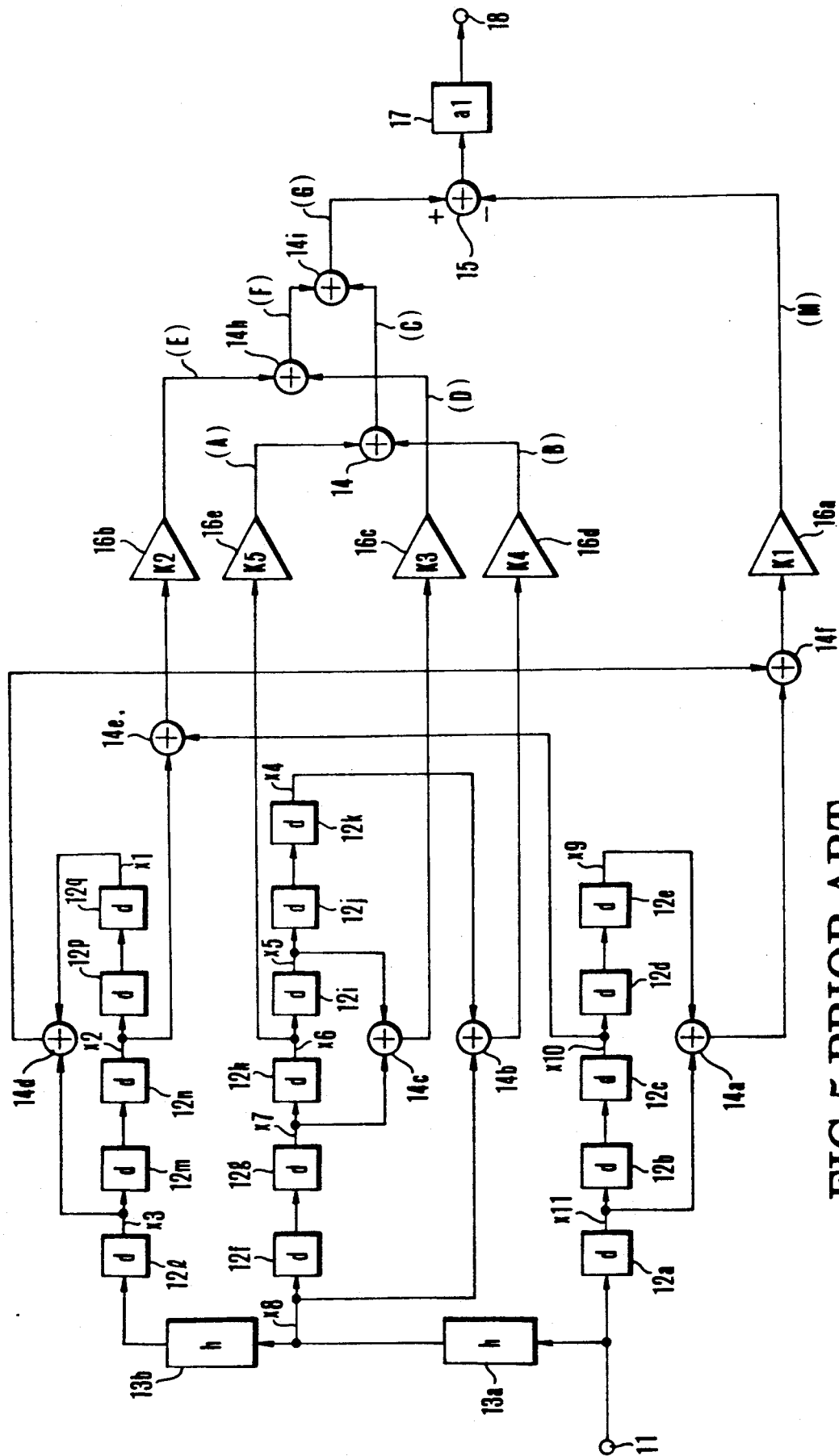
FIG. 5 is a circuit diagram showing by way of example, the arrangement of the conventional digital spatial filter.
Figure 6:
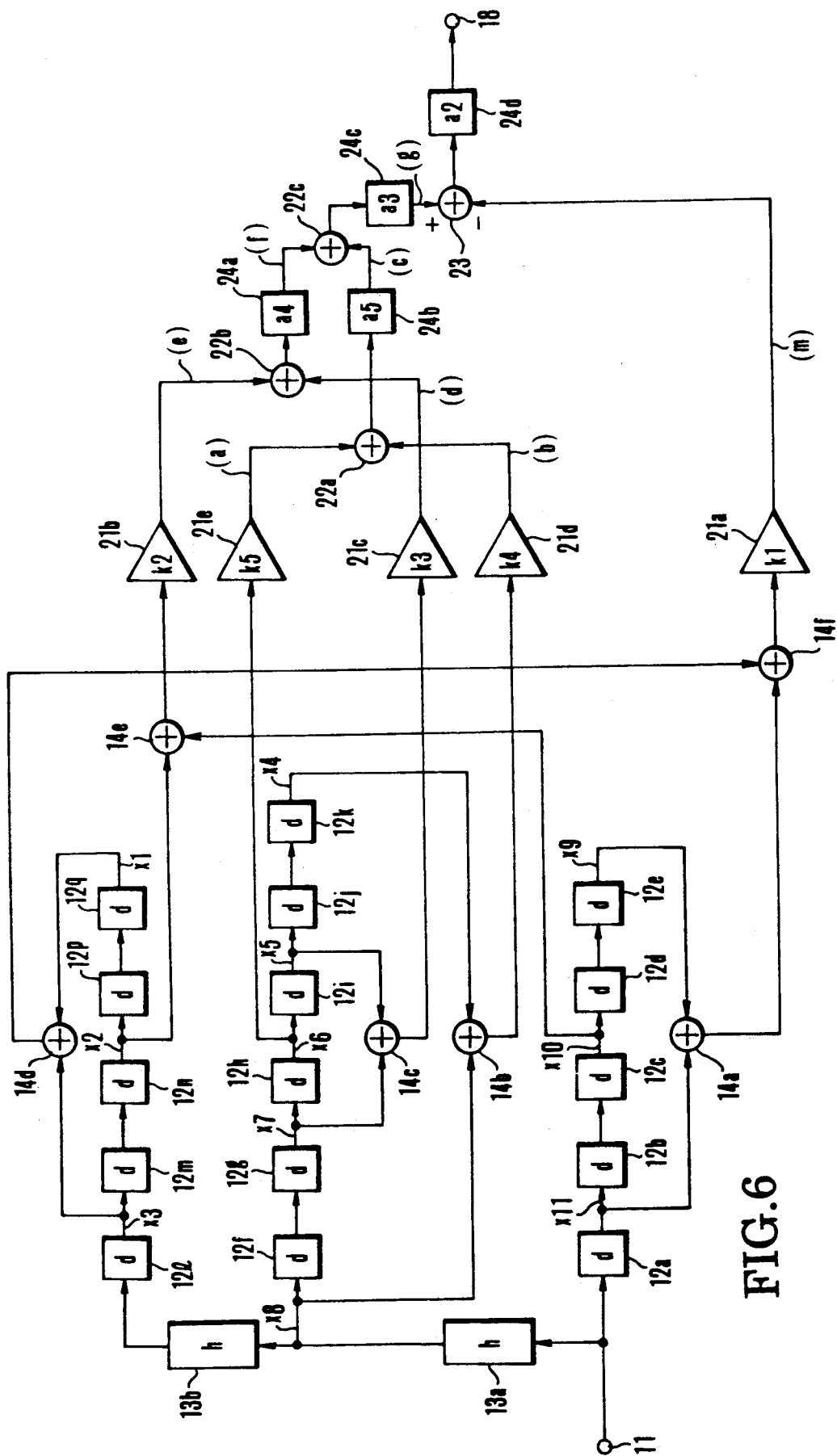
FIG. 6 is a circuit diagram showing the arrangement of a digital filter as an embodiment of this invention.

The following describes the embodiments of this invention with reference to the drawings:

FIG. 6 shows the arrangement of a digital filter arranged according to the invention as an embodiment thereof. In FIG. 6, the same component parts as those of FIG. 5 are indicated by the same reference numerals and the details of them are omitted from the following description. The embodiment includes multipliers 21a to 21e which are arranged to perform multiplying operations by using the respective coefficients k1 to k5; adders 22a to 22c; a subtracter 23; and dividers 24a, 24b, 24c and 24d which are arranged to perform dividing operation by using the respective constants a5, a4, a3 and a2.

The constants to be used by the multipliers 21a to 21e and the dividers 24a to 24d of this embodiment are as follows: $k1=16/64$, $k2=31/16$, $k3=57/16$, $k4=8/16$, $k5=128/16$, $a2=4$, $a3=2$, $a4=2$ and $a5=2$.

With the filter having the constants set in this manner, the embodiment is capable of giving an output signal which is exactly the same as the output signal obtainable from the conventional filter shown in FIG. 5.

The multipliers 21a to 21e are composed of ROMs. A value to be multiplied by the coefficient is arranged to be an address input P. Data Q read out from the ROM is arranged to be a multiplication output. For example, the multiplier 21a is arranged to have a ROM table set in such a way as to have the data Q=16P/64.

Since the divisor of each of the dividers 24a to 24d is a value which is a power of 2, the dividers 24a to 24d can be simply formed with a bit shift circuit.

As a result, the maximum value and the number of necessary bits of the parts (a), (b), (c), (d), (e), (f), (g) and (m) of the digital filter of FIG. 6 are shown below:

|     | maximum value | number of necessary bits |
|-----|---------------|--------------------------|
| (a) | 2040          | 11                       |
| (b) | 255           | 8                        |
| (c) | 1147          | 11                       |
| (d) | 1816          | 11                       |
| (e) | 988           | 10                       |
| (f) | 1402          | 11                       |
| (g) | 1275          | 11                       |
| (m) | 255           | 8                        |

As apparent from the foregoing description, the arrangement of the digital filter of this embodiment greatly reduces the number of bits required by each part as compared with the conventional digital filter shown in FIG. 5. This advantage enables the adders 22a to 22c and the subtracter 23 to operate at a higher speed than the adders 14g to 14i and the subtracter 15 of the conventional digital filter of FIG. 5. The digital filter as a whole is thus capable of carrying out a high speed processing operation.

In the case of this embodiment, the invention is applied to a digital spatial filter arranged at a stage preceding a sub-sampling process. However, the invention is not limited to such a digital filter but is likewise advantageously applicable also to digital filters of other kinds, such as a digital spatial filter provided for data interpolation or a filter for a line-sequential conversion process. In accordance with the arrangement of the filter of FIG. 6, as described above, the speed of the processing operation of the digital filter can be increased in carrying out the same filtering process as that of the prior art.

Figure 7:
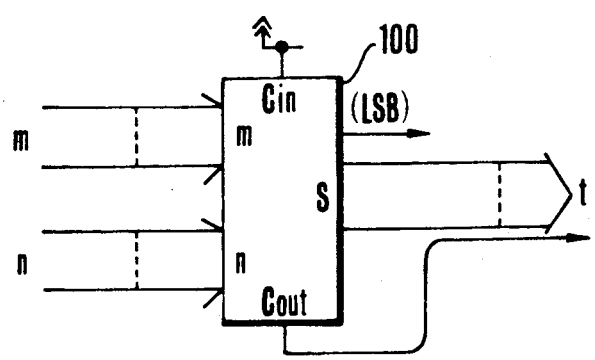
FIG. 7 is a diagram showing by way of example the arrangement of an adder and a divider included in FIG. 6.

Next, an example of modification of the filter shown in FIG. 6 is arranged as described below:

In the case of this modification, a round-off function (counting fraction over $\frac{1}{2}$ as one and disregarding the rest) is imparted to the adders 22a to 22c. FIG. 7 shows by way of example the arrangement of a pair of the adder 22a and the subtracter 24a, a pair of the adder 22b and the subtracter 24b and a pair of the adder 22c and the subtracter 24c of FIG. 6. Referring to FIG. 7, a full adder 100 has a carry input Cin. This carry input Cin is always logically positive. Each of data n and data m which comes to the adder 100 consists of i bits (11 bits will suffice, as apparent from the foregoing description). These data inputs n and m are added together by the full adder 100 which performs an adding operation of (n+m+1). The output value of the full adder 100 is then shifted by one bit. A carry output Cout is produced as the MSB while the LSB is removed. In accordance with this arrangement, the data t of i bits which is thus output from the full adder 100 becomes (n+m+1)/2. In other words, the sum of two data is divided by 2, and a round-off operation (counting fraction over $\frac{1}{2}$ as one and disregarding the rest) is performed.

With the modification arranged in this manner, the computing accuracy of the filter is further enhanced.

Figure 8:
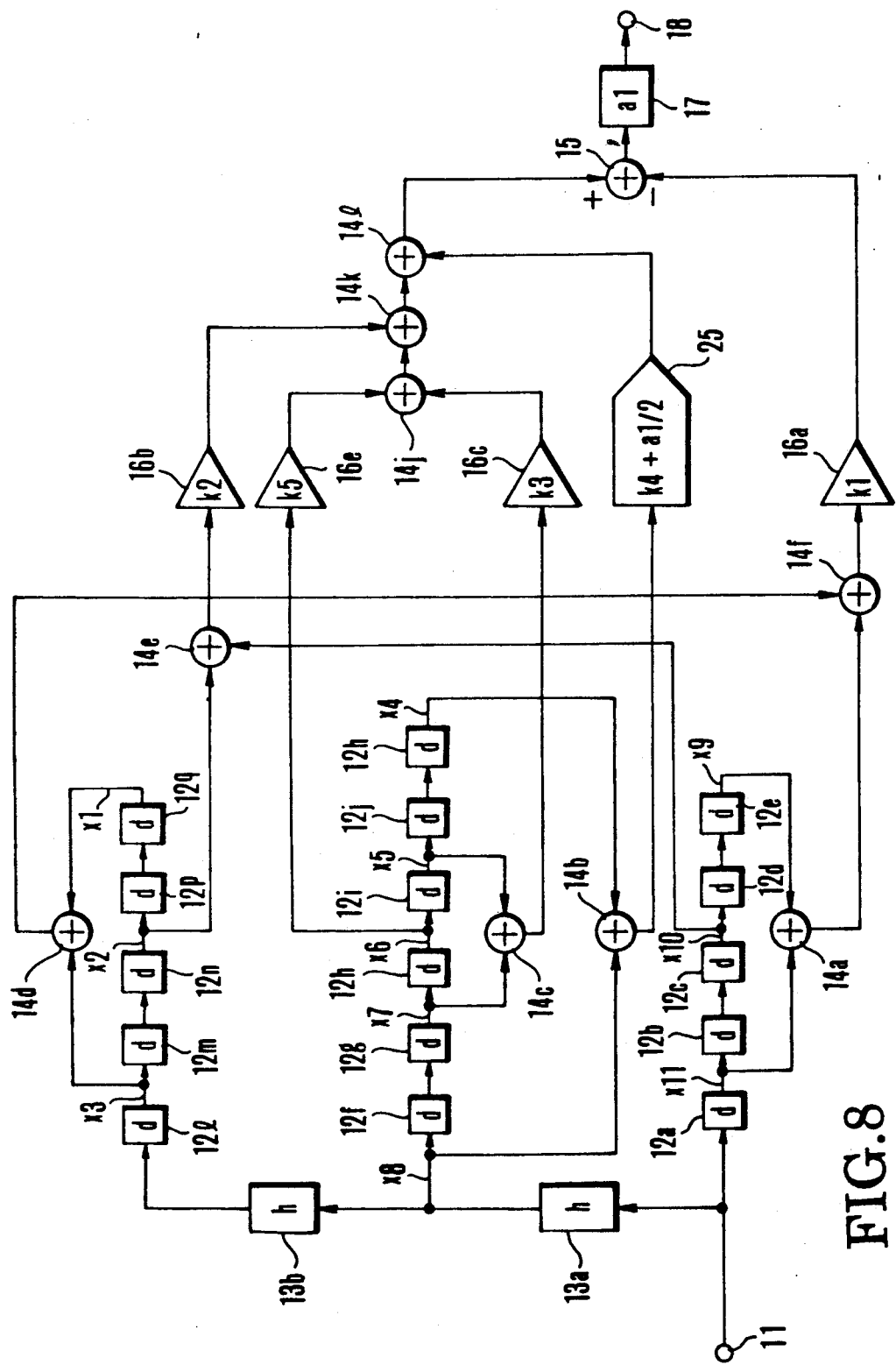
FIG. 8 is a circuit diagram showing the arrangement of a digital filter as another embodiment of the invention.

FIG. 8 is a block diagram showing the arrangement of another embodiment of the invention. In FIG. 8, the same component parts as those of FIG. 5 are indicated by the same reference numerals. Adders 14j, 14k and 14l shown in FIG. 8 are arranged to give the same result of addition as the adders 14g, 14h and 14i shown in FIG. 5 although they differ in respect of adding sequence. The main point in which the embodiment differs from the arrangement of FIG. 5 lies in that the multiplier 16d of FIG. 5 is replaced with a computing circuit 25 which has an adding function as well as the multiplying function. In other words, the computing circuit 25 is arranged to perform a computing operation on an input "x" to obtain an output value which can be expressed as $(x \times k4 + a1/2)$. More specifically, a coefficient ROM which has the memory address and the stored value arranged to be in this relation is used. For example, assuming that the input "x" is data of eight bits and of a value between 0 and 255, the coefficient k4 is 15, and the divisor a1 of the divider 17 is 16, when the data "x" is supplied to the address of the ROM, the ROM outputs a value corresponding to $(x \times 15 + 8)$. Accordingly, a division result obtained by the divider 17 corresponds to a value subjected to a round-off operation instead of a round-down operation. The addition of $(a\frac{1}{2})$ may be arranged to be accomplished by some other coefficient ROM that includes the multiplies 16b, 16e, 16c and 16a.

Figure 9:
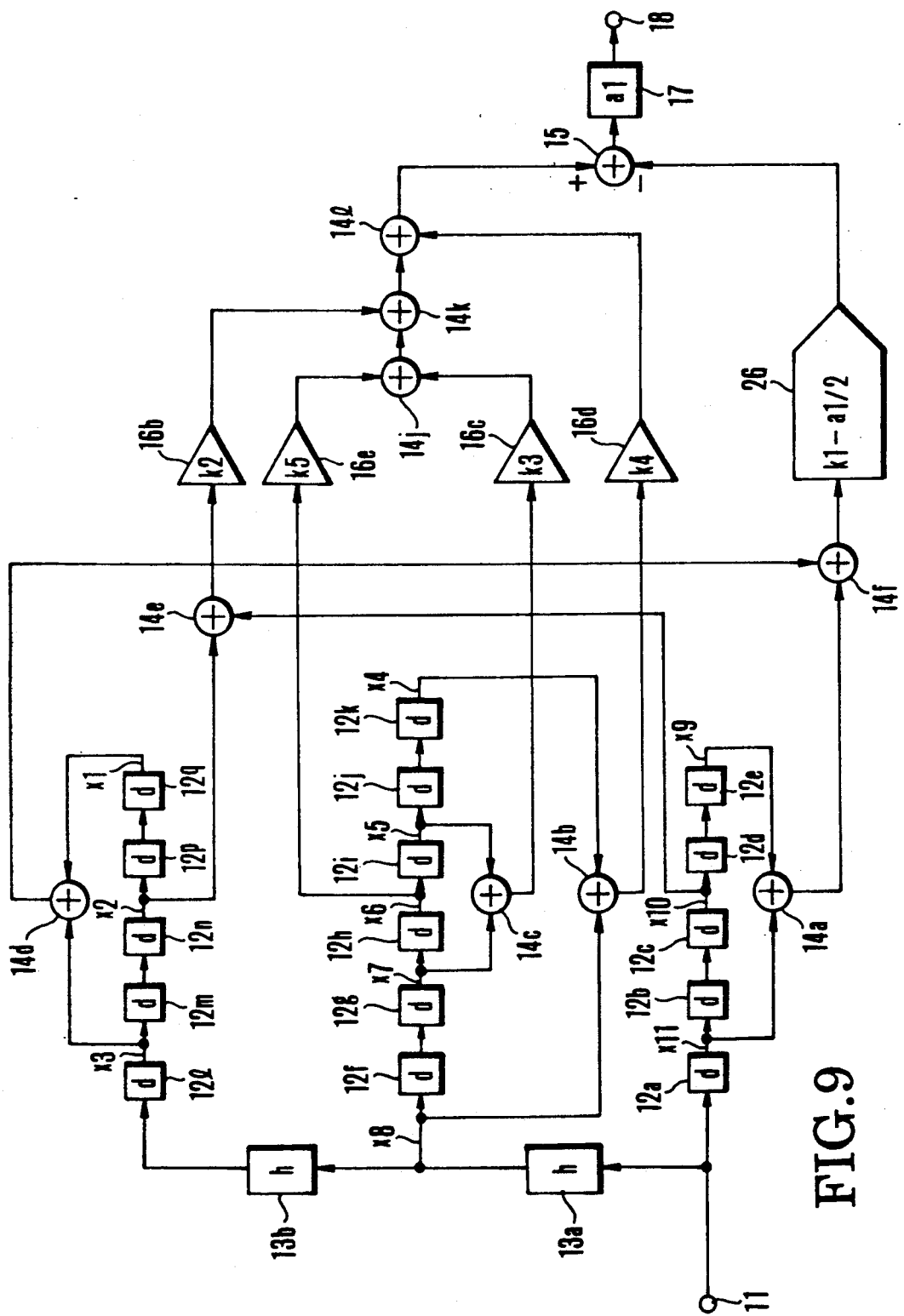
FIG. 9 is a diagram showing the arrangement of a digital filter as a further embodiment of the invention.

FIG. 9 is a block diagram showing the arrangement of a further embodiment of the invention. In this case, the constant $(a\frac{1}{2})$ is arranged to be subtracted at a part corresponding to the multiplier 16a. In FIG. 9, the same circuit elements as those of FIG. 5 are indicated by the same reference numerals. A computing circuit 26 is arranged in place of the multiplier 16a. The computing circuit 26 is arranged to perform a computing operation on an input "x" in such a way as to obtain an output value which can be expressed as $(x \times k4 - a\frac{1}{2})$. More specifically, the circuit arrangement includes a coefficient ROM which is arranged to obtain the above-stated result of computation. The purpose of a round-off operation (counting fraction over $\frac{1}{2}$ as one and disregarding the rest) is attainable also by this arrangement.

In the case of the embodiment described, the invention is applied to a sub-sampling spatial filter. However, the invention is applicable also to such a spatial filter that is to be used for an interpolating operation or a color-difference line-sequential converting operation.

As apparent from the foregoing, the digital filters shown in FIGS. 8 and 9 are capable of obtaining the ultimate result of computation in the form of a round-off operation (counting fraction over $\frac{1}{2}$ as one and disregarding the rest) without increasing the hardware arrangement. Therefore, the filtering process can be carried out without causing much deterioration of picture quality.

What is claimed is:

1. A digital filter comprising:
   a) sample extracting means including an input terminal for serially receiving a plurality of samples and a delay circuit for delaying the plurality of samples for respective delay periods different from each other to output simultaneously the plurality of samples, each sample consisting of a plurality of binary bits;
   b) a multiplying circuit for multiplying the plurality of samples outputted by said sample extracting means by respective predetermined multiplying numbers, at least one of said multiplying numbers being $X/2^Y$, X being an odd number, Y being an integer which is 1 or more;

c) a plurality of first adding circuits for respectively adding together at least two of the outputs of said multiplying circuit;
d) a first dividing circuit for dividing at least two of the outputs of said plurality of first adding circuits by respective predetermined dividing numbers, the respective predetermined dividing number being $2^n$, n being an integer which is 1 or more;
e) a second adding circuit for adding together at least two outputs of said first dividing circuit; and
f) a second dividing circuit for dividing an output of said second adding circuit by a predetermined number, the predetermined dividing number being $2^n$.

2. A digital filter according to claim 1, further comprising a round-off circuit for rounding off data obtained between said first dividing circuit and said second dividing circuit.

3. A digital filter according to claim 1, wherein said multiplying circuit is composed of a look-up table circuit.

4. A digital filter according to claim 1, wherein said first and second dividing circuits are arranged to shift each bit of binary data.

5. A digital filter according to claim 1, further comprising a third according circuit for adding data of a sample other than the plurality of samples to an output of said second dividing circuit, and a third dividing circuit for dividing an output of said third adding circuit by a predetermined number.

6. A digital filter according to claim 5, further comprising a round-off circuit for rounding off data obtained between said second dividing circuit and said third dividing circuit.

7. A digital filter comprising:
a) sample extracting means including an input terminal for serially receiving first, second, third and fourth samples and a delay circuit for delaying the first, second, third and fourth samples for respective delay periods different from each other to output simultaneously the first, second, third, and fourth samples, each of which consists of a plurality of binary bits;
b) first, second, third, and fourth multiplying circuits for multiplying the first, second, third, and fourth samples outputted by said sample extracting means by respective predetermined multiplying numbers, each of said first, second, third and fourth multiplying circuits reducing a number of bits for a multiplying result thereof;
c) a first adding circuit for adding together the multiplying results of said first and second multiplying circuits;
d) a second adding circuit for adding together the multiplying results of said third and fourth multiplying circuits;
e) a first dividing circuit for dividing an output of said first adding circuit by a first predetermined dividing number;
f) a second dividing circuit for dividing an output of said second adding circuit by a second predetermined dividing number;
g) a third adding circuit for adding together outputs of said first and second dividing circuits; and
h) a third dividing circuit for dividing an output of said third adding circuit by a third predetermined dividing number, each of said first, second and third dividing circuits reducing a number of bits for a dividing results thereof.

8. A digital filter according to claim 7, further comprising a round-off circuit for rounding off data obtained between said first and second dividing circuits and said third dividing circuit.

9. A digital filter according to claim 7, wherein each of said first, second, third, and fourth multiplying circuits is composed of a look-up table circuit.

10. A digital filter according to claim 7, wherein said first, second, and third dividing circuits are arranged to shift each bit of binary data.

11. A digital filter according to claim 7, wherein said input terminal receives a fifth sample serially with the first, second, third and fourth samples and said delay circuit outputs the fifth sample simultaneously with the first, second, third, and fourth samples.

12. A digital filter according to claim 11, further comprising a fourth adding circuit for adding data of the fifth sample to an output of said third dividing circuit, and a fourth dividing circuit for dividing an output of said fourth adding circuit by a predetermined number, and wherein said fourth dividing circuit reduces a number of bits for a dividing result thereof.

13. A digital filter comprising:
a) sample extracting means including an input terminal for serially receiving a plurality of samples and a delay circuit for delaying the plurality of samples for respective delay periods different from each other to output simultaneously first and second samples;
b) a multiplying circuit for multiplying the first sample outputted by said sample extracting means by a first predetermined number;
c) a look-up table circuit for multiplying the second sample outputted by said sample extracting means by a second predetermined number to obtain a multiplication result and for adding a third predetermined number to the multiplication result to obtain an output;
d) an adding circuit for adding together an output of said multiplying circuit and the output of said look-up table circuit; and
e) a dividing circuit for dividing an output of said adding circuit by a fourth predetermined number.

14. A digital filter according to claim 13, wherein said fourth predetermined number is two times as great as said third predetermined number.

15. A digital filter according to claim 13, wherein said multiplying circuit is composed of another look-up table circuit.

16. A digital filter comprising:
a) sample extracting means including an input terminal for serially receiving a plurality of samples and a delay circuit for delaying the plurality of samples for respective delay periods different from each other to output simultaneously a plurality of samples;
b) a plurality of computing circuits for subjecting the plurality of samples outputted by said sample extracting means to respective predetermined computing operations, at least one of said plurality of computing circuits including a look-up table circuit for multiplying the sample input thereby by a first predetermined number to obtain a multiplication result and for adding a second predetermined number to the multiplication result to obtain an output;

c) an adding circuit for adding together the plurality of outputs of said plurality of computing circuits; and d) a dividing circuit for dividing an output of said adding circuit by a third predetermined number.

17. A digital filter according to claim 16, wherein said third predetermined number is two times as great as said second predetermined number.

18. A digital filter according to claim 16, wherein each of said plurality of computing circuits is composed of a further look-up table circuit.

19. A computing circuit comprising:
a) input terminal means for inputting simultaneously a plurality of samples;
b) a plurality of computing circuits for subjecting the plurality of samples input by said input terminal means to respective predetermined computing operations, at least one of said plurality of computing circuits including a look-up table circuit for multiplying the sample input thereby by a first predetermined number to obtain a multiplication result and for adding a second predetermined number to the multiplication result to obtain an output;
c) an adding circuit for adding together the plurality of samples output from said plurality of computing circuits; and
d) a dividing circuit for dividing an output of said adding circuit by a third predetermined number.

20. A computing circuit according to claim 19, wherein said third predetermined number is two times as great as said second predetermined number.

21. A computing circuit according to claim 19, wherein each of said plurality of computing circuits is composed of a further look-up table circuit.

22. A computing circuit comprising:
a) input terminal means for inputting simultaneously first and second samples;
b) a multiplying circuit for multiplying the first sample input by said input terminal means by a first predetermined number;
c) a look-up table circuit for multiplying the second sample input by said input terminal means by a second predetermined number to obtain a multiplication result and for adding a third predetermined number to the multiplication result to obtain an output;
d) an adding circuit for adding together the first sample output from said multiplying circuit and the output of said look-up table circuit; and
e) a dividing circuit for dividing an output of said adding circuit by a fourth predetermined number, said fourth predetermined number being two times as great as said third predetermined number.

* * * * *

UNITED STATES PATENT AND TRADEMARK OFFICE
CERTIFICATE OF CORRECTION

PATENT NO. : 5,130,942
DATED : July 14, 1992
INVENTOR(S) : Masahiko Enari

It is certified that error appears in the above-identified patent and that said Letters Patent is hereby corrected as shown below:

Col. 6, line 1.  Change "14L" to -- 14 --
Col. 6, line 24. Change "multiplies" to -- multiples --
Col. 7, line 26. Change "according" to -- adding --

Signed and Sealed this

Thirty-first Day of August, 1993

Attest:

BRUCE LEHMAN

Attesting Officer

Commissioner of Patents and Trademarks